United States Patent
Thummalapally

(10) Patent No.: US 7,633,784 B2
(45) Date of Patent: Dec. 15, 2009

(54) JUNCTION FIELD EFFECT DYNAMIC RANDOM ACCESS MEMORY CELL AND CONTENT ADDRESSABLE MEMORY CELL

(75) Inventor: Damodar R. Thummalapally, Milpitas, CA (US)

(73) Assignee: DSM Solutions, Inc., Los Gatos, CA (US)

( * ) Notice: Subject to any disclaimer, the term of this patent is extended or adjusted under 35 U.S.C. 154(b) by 82 days.

(21) Appl. No.: 11/804,132

(22) Filed: May 17, 2007

(65) Prior Publication Data

US 2008/0285322 A1    Nov. 20, 2008

(51) Int. Cl.
*G11C 15/00* (2006.01)

(52) U.S. Cl. .............. 365/49.12; 365/49.1; 365/49.11; 365/49.17

(58) Field of Classification Search ............. 365/49.1, 365/49.11, 49.12, 49.17
See application file for complete search history.

(56) References Cited

U.S. PATENT DOCUMENTS

| | | | |
|---|---|---|---|
| 4,779,226 A * | 10/1988 | Haraszti | 365/49.1 |
| 6,169,684 B1 * | 1/2001 | Takahashi et al. | 365/49.12 |
| 6,262,907 B1 * | 7/2001 | Lien et al. | 365/49.12 |
| 6,563,754 B1 * | 5/2003 | Lien et al. | 365/222 |
| 6,573,549 B1 * | 6/2003 | Deng et al. | 257/296 |
| 6,760,249 B2 * | 7/2004 | Chien | 365/154 |
| 6,807,077 B2 * | 10/2004 | Noda et al. | 365/49.17 |
| 2002/0044475 A1 * | 4/2002 | Lines et al. | 365/49 |
| 2003/0169612 A1 * | 9/2003 | Hu | 365/49 |
| 2003/0227788 A1 * | 12/2003 | Lien | 365/49 |
| 2004/0132232 A1 * | 7/2004 | Noble | 438/142 |
| 2004/0266088 A1 * | 12/2004 | Luyken et al. | 438/202 |
| 2008/0054324 A1 * | 3/2008 | Luyken et al. | 257/296 |
| 2008/0265936 A1 * | 10/2008 | Vora | 326/41 |
| 2008/0272405 A1 * | 11/2008 | Thummalapally | 257/256 |
| 2008/0273373 A1 * | 11/2008 | Braceras et al. | 365/154 |

FOREIGN PATENT DOCUMENTS

EP          1355316 A1      10/2003

OTHER PUBLICATIONS

PCT International Search Report and Written Opinion of the International Searching Authority for International Application No. PCT/US2008/062819, dated Sep. 26, 2008.
U.S. Appl. No. 11/261,873, Kapoor, Ashok.
U.S. Appl. No. 11/507,793, Kapoor, Ashok.
U.S. Appl. No. 11/799,305, Thummalalpally, Damodar.

* cited by examiner

*Primary Examiner*—Ly D Pham
(74) *Attorney, Agent, or Firm*—Darryl G. Walker

(57) ABSTRACT

A semiconductor memory device including a dynamic random access memory (DRAM) cell and a ternary content addressable memory (TCAM) cell is disclosed. The DRAM cell may include a data storing portion and a data read portion. The data storing portion and data read portion comprising p-channel junction field effect transistors. The TCAM cell including an x-cell, y-cell, and comparator circuit. The x-cell, y-cell, and comparator circuits comprising p-channel JFETs.

27 Claims, 5 Drawing Sheets

JUNCTION FIELD EFFECT DYNAMIC RANDOM ACCESS MEMORY CELL AND CONTENT ADDRESSABLE MEMORY CELL

TECHNICAL FIELD

The present invention relates generally to semiconductor devices, and more particularly to a junction field effect transistor dynamic random access memory cell and content addressable memory cell.

BACKGROUND OF THE INVENTION

A typical dynamic random access memory (DRAM) cell includes a metal-oxide-semiconductor field effect transistor (MOSFET) and a capacitor. The MOSFET is used as a pass transistor to allow charge to be transferred to and from a capacitor used to store data.

Memory devices, such as random access memories (RAMs) and read only memories (ROMs) access single entries according to applied addresses, however, other types of memory devices can provide a matching function with respect to all entries in the device. One such type of memory device is a content addressable memory (CAM) device.

CAMs provide a rapid comparison between a specific pattern of received data bits, commonly known as a search key or comparand, and data values stored in an associative CAM memory array to provide a match/no-match result. If there is a match for every bit in a group of stored bits in selected CAM memory cells, with every corresponding bit in the comparand, a match flag via a match line indicates a match condition. In this way, the user is notified that the data in the comparand was found in memory and a value corresponding to the match is returned. Thus, the result is determined from finding a matching value (content), not from providing the address of the value as done for a Random Access Memory (RAM).

Generally, there are two types of CAM cells typically used in CAM arrays: binary CAM cells and ternary CAM or TCAM cells.

Binary CAM cells store either a logic high bit value or a logic low bit value. When the logic value stored in the binary CAM cell matches a data bit from an applied comparand, then that CAM cell provides a high impedance path to the match line and the match line is maintained at a logic high value (assuming all other CAM cells electrically connected to the CAM array row also match). In this way, a match is indicated. However, when the logic value stored in the binary CAM cell does not match the data bit from the applied comparand, then that CAM cell provides a low impedance path to ground to the match line and the match line is pulled low. In this way, it is indicated that a match has not occurred.

TCAM cells can store three bit values including a logic high value, a logic low value, and a "don't care" value. When storing logic high and logic low values, the TCAM cell operates like a binary CAM cell as described above. However, a TCAM cell storing a "don't care" value will provide a match condition for any data bit value from a comparand applied to that TCAM cell. This "don't care" capability allows CAM arrays to indicate when a data value matches a selected group of TCAM cells in a row of the CAM array. For example, assume each row of a TCAM array has eight TCAM cells. Additionally, assume that the first four TCAM cells of each row store one of a logic high and a logic low value (for comparison to the first four bits of an 8-bit comparand data value) and the last four TCAM cells of each row store "don't care" values. Under these conditions, when an 8-bit comparand data value is applied to the CAM array, a match occurs for each row of the CAM array in which the data values stored in the first four TCAM cells match the first four bits of the applied 8-bit comparand data value. An exemplary embodiment of an existing TCAM cell is set forth in FIG. 1 in a circuit schematic diagram and given the general reference character 100.

TCAM cell 100 includes a X-cell 110, a Y-cell 120, and a compare circuit 130. TCAM cell 100 has complementary bit lines (BLY and BLY_) as inputs to Y-cell 120, and complementary bit lines (BLX and BLX_) as inputs to X-cell 110. X-cell 110 and Y-cell 120 receive a word line WL as a common input. Compare circuit 130 receives complementary compare data (CD and CD_N) as inputs as well as receiving X-cell stored data and Y-cell stored data respectively at inputs (YD and XD). Compare circuit 130 provides a match output ML.

X-cell 110 and Y-cell 120 are essentially Static Random Access Memory (SRAM) cells having two inverters and two pass metal-oxide-semiconductor field effect transistors (MOSFETs). Compare circuit 130 has two serially connected MOSFETs providing the X-cell compare and two serially connected MOSFETs providing the Y-cell compare.

SUMMARY OF THE INVENTION

According to the present embodiments, semiconductor memory device including a dynamic random access memory (DRAM) cell and a ternary content addressable memory (TCAM) is disclosed. The DRAM cell may include a data storing portion and a data read portion. The data storing portion and data read portion comprising p-channel junction field effect transistors. The TCAM cell including an x-cell, y-cell, and comparator circuit. The x-cell, y-cell, and comparator circuits comprising p-channel JFETs.

According to the embodiments, a DRAM cell may include a data storing portion and a data read portion. The data storing portion may include a p-channel JFET and may be coupled to receive a write bit line and a write word line as inputs and may have a data storing node having a data storing node logic value. The data read portion may include a p-channel JFET and may be coupled to receive the data storing node and a read word line as inputs and may provide read data on a read word line. The read data may have a read data logic value that corresponds to the data storing node logic value.

According to the embodiments, a content addressable memory cell may include a first JFET having a first controllable impedance path coupled between a first bit line and a first data storing node, the first JFET includes a first control gate terminal coupled to a word line. A first capacitor may have a first terminal coupled to the first data storing node. A first stack may include a second JFET having a second controllable impedance path and a third JFET having a third controllable impedance path, the second and third controllable impedance paths coupled in series between a first potential and a match line and the second JFET can include a second control gate terminal coupled to the first data storing node. The third JFET includes a third control gate terminal coupled to receive first compare data.

The CAM cell may further include a fourth JFET having a fourth controllable impedance path coupled between a second bit line and a second data storing node, the fourth JFET includes a first control gate terminal coupled to a word line. A second capacitor may have a first terminal coupled to the first data storing node. A second stack may include a fifth JFET having a fifth controllable impedance path and a sixth JFET having a sixth controllable impedance path, the fifth and sixth controllable impedance paths may be coupled in series between the first potential and the match line and the fifth JFET can include a fifth control gate terminal coupled to the second data storing node. The sixth JFET includes a sixth control gate terminal coupled to receive second compare data.

According to the embodiments, a memory cell may include a first junction field effect transistor (JFET) having a first controllable impedance path coupled between a first bit line and a data storing node, the first JFET includes a first control gate terminal coupled to a first word line. The memory cell may include a capacitor having a first terminal coupled to the data storing node and a second terminal coupled to a first potential.

According to the embodiments, the DRAM cell and CAM cell may comprise p-channel JFETs. The CAM cell may be a ternary CAM cell.

DETAILED DESCRIPTION OF THE EMBODIMENTS

The present invention is directed to Content Addressable Memories (CAMs) and more specifically to a ternary CAM (TCAM) cell and more particularly to a TCAM cell that includes JFETs.

In the following description, for purposes of explanation, numerous specific details are set forth in order to provide a thorough understanding of the present invention. It will be evident, however, to one skilled in the art that the present invention may be practices without these specific details. In other instances, well-known circuits, structures, and techniques may not be shown in detail or may be shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearance of the phrase "in one embodiment" in various places in the specification do not necessarily all refer to the same embodiment. The term "to couple" or "electrically connect" as used herein may include both to directly and to indirectly connect through one or more intervening components.

The circuits of the present invention can be used on a semiconductor device and more particularly a semiconductor memory device.

Various embodiments of the present invention will now be described in detail with reference to a number of drawings. The embodiments show a content addressable memory (CAM) cell including junction field effect transistors (JFETs).

Figure 1:
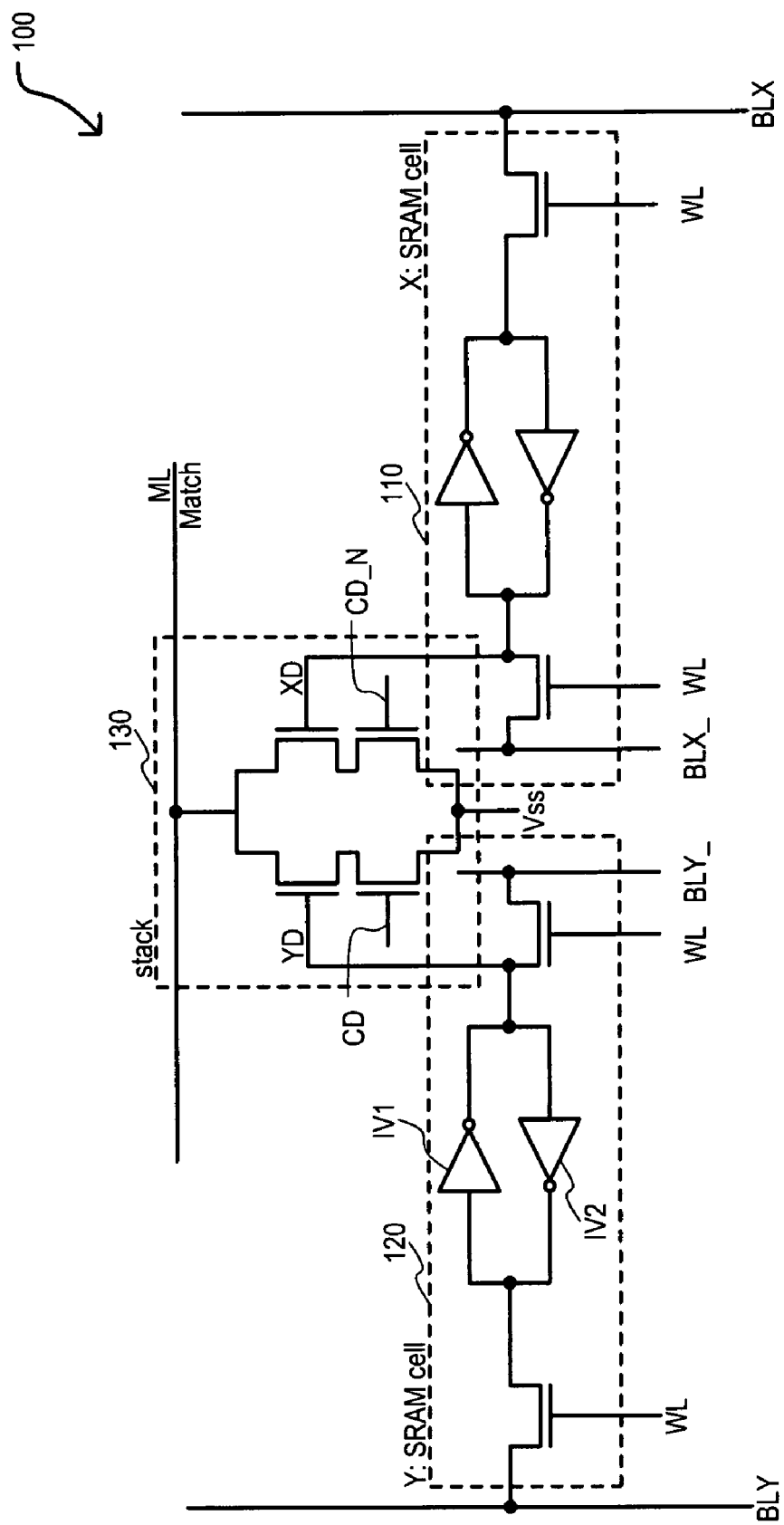
FIG. 1 is a circuit schematic diagram of a conventional ternary content addressable memory (TCAM) cell.
Figure 2:
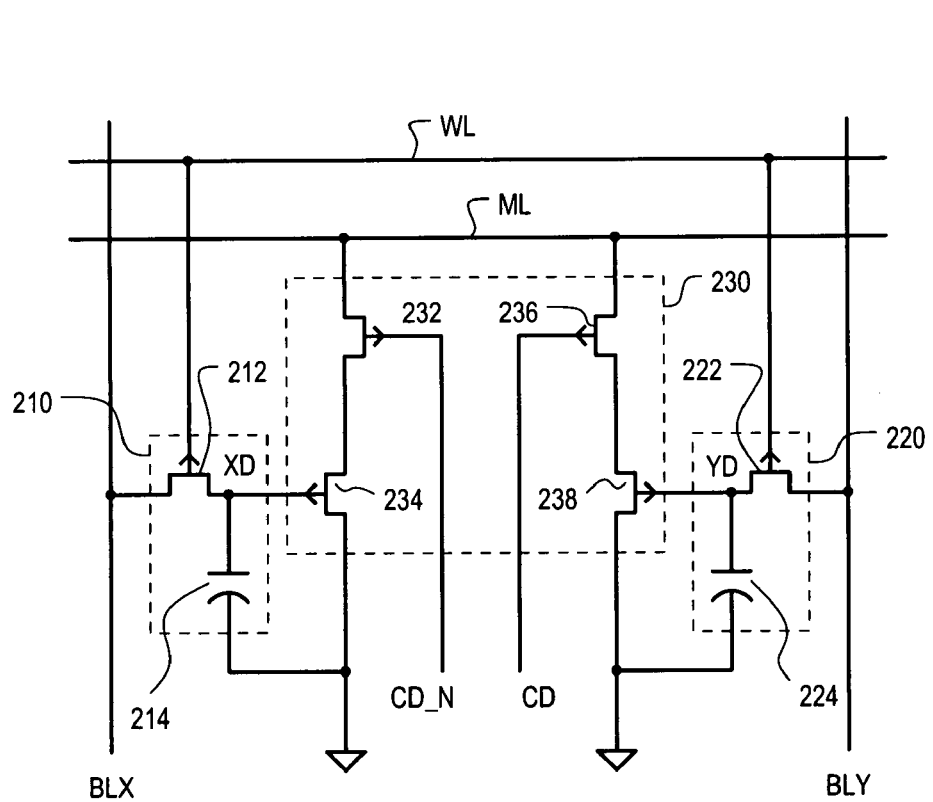
FIG. 2 is a circuit schematic diagram of a TCAM cell according to an embodiment.

Referring now to FIG. 2, a circuit schematic diagram of a ternary content addressable memory (TCAM) cell according to an embodiment is set forth and given the general reference character 200.

TCAM cell 200 includes a X-cell 210, a Y-cell 220, and a compare circuit 230. TCAM cell 200 has a bit line BLX as an input to X-cell 210, and bit lines BLY as an input to Y-cell 220. X-cell 210 and Y-cell 220 receive a word line WL as a common input. Compare circuit 230 receives complementary compare data (CD and CD_N) as inputs as well as receiving X-cell stored data and Y-cell stored data respectively at data storing nodes (YD and XD). Compare circuit 230 provides a match output ML. Complementary compare data (CD and CD_N) may include compare data CD and compare data complement CD_N.

X-cell 210 can include a pass transistor 212 and a capacitor 214. Pass transistor 212 can be a p-channel JFET and can have a first source/drain terminal connected to bit line BLX and a second source/drain terminal connected to a first terminal of capacitor 214 to provide X-cell data from data storing node XD. Pass transistor 212 can have a control gate terminal connected to word line WL. Capacitor 214 can have a second terminal connected to a ground potential.

Y-cell 220 can include a pass transistor 222 and a capacitor 224. Pass transistor 222 can be a p-channel JFET and can have a first source/drain terminal connected to bit line BLY and a second source/drain terminal connected to a first terminal of capacitor 224 to provide Y-cell data from data storing node YD. Pass transistor 222 can have a control gate terminal connected to word line WL. Capacitor 224 can have a second terminal connected to a ground potential.

Compare circuit 230 can receive X-cell data from data storing node XD, Y-cell data from data storing node YD, and complementary compare data (CD and CD_N) as inputs. Compare circuit 230 can include a first compare stack including p-channel JFETs (232 and 234) and a second compare stack including p-channel JFETs (236 and 238).

In the first compare stack, p-channel JFET 232 can have a drain terminal connected to a match line ML, a source terminal connected to a drain terminal of p-channel JFET 234, and a control gate connected to receive compare data complement CD_N. P-channel JFET 234 can have a source terminal connected to a ground potential and a control gate terminal connected to receive X-cell data from data storing node XD in X-cell 210.

In the second compare stack, p-channel JFET 236 can have a drain terminal connected to a match line ML, a source terminal connected to a drain terminal of p-channel JFET 238, and a control gate connected to receive compare data CD. P-channel JFET 238 can have a source terminal connected to a ground potential and a control gate terminal connected to receive Y-cell data from data storing node YD in Y-cell 220.

In operation, TCAM cell 200 may store a one value ("1"), a zero value ("0") or a "don't care" value ("1/0"). In the one value ("1"), X-cell 210 stores a logic high at data storing node XD and Y-cell 220 stores a logic low value at data storing node YD. In the zero value ("0"), X-cell stores 210 a logic low at data storing node XD and Y-cell 220 stores a logic high value at data storing node YD. In the "don't care" value ("0/1"), X-cell stores 210 a logic high at data storing node XD and Y-cell 220 stores a logic high value at data storing node YD.

Before a compare operation, compare data and complementary compare data lines (CD and CD_N) may be initially (precharged) at a high level (Vcc), while match line ML may be initially (precharged) at a high level, such as Vcc. In the particular embodiment, match line may be initially biased to a voltage greater than |Vtp|, where Vtp is the threshold voltage of a p-channel JFET. In the particular embodiment, the match line ML may be precharged to about 0.5 volts. Because, compare data and complementary compare data lines (CD and CD_N) are at a high level, p-channel JFETs (232 and 236) are turned off. With p-channel JFETs (232 and 236) turned off, current is prevented from flowing through p-channel JFET compare stacks (232-234 and 236-238) from the match line ML to ground Vss.

When the compare operation occurs, either compare data line or complementary compare data line (CD or CD_N) transitions to a low level. In this way, one of the compare stacks (232-234 and 236-238) becomes enabled by turning on the respective p-channel JFET (232 or 236). A mis-match may occur when the enabled compare stack (232-234 and 236-238) receives a logic low level from the respective data storing node (XD or YD) at the respective p-channel JFETs (234 or 238). When a compare mis-match occurs both p-channel JFETs in the enabled compare stack (232-234 and 236-238) are turned on and the match line ML is pulled to ground Vss. On the other hand, a match may occur when the enabled compare stack (232-234 and 236-238) receives a logic high level from the respective data storing node (XD or YD) at the respective p-channel JFET (234 or 238). When a compare match occurs the lower p-channel JFET (234 or 238) in the enabled compare stack (232-234 and 236-238) is turned off and the match line ML remains at the precharge level (high or Vcc).

A match may be conceptualized as a hit and a mis-match may be conceptualized as a miss. Thus, when a match occurs, a sense amplifier (not shown) coupled to match line ML may detect a "hit" and when a mis-match occurs, the sense amplifier may detect a "miss."

However, when TCAM 200 stores a "don't care" value ("1/0"), both data storing nodes (XD and YD) store a logic one. With both data storing nodes (XD and YD) storing a logic one (i.e. a high level such as Vcc), p-channel JFETS (234 and 238) are turned off and compare circuit 230 indicates a match and the match line ML remains at the precharge level (high or Vcc).

X-cell 210 and Y-cell 220, respectively, include a capacitor (214 and 224) for storing a charge representative of data on respective data storing nodes (XD and YD). X-cell 210 and Y-cell 220, respectively, may include a p-channel JFET (212 and 222) that may operate as a pass transistor to allow charge to be transferred to or from a respective capacitor (214 and 224) and a respective bit line (BLX and BLY).

In a write operation, word line WL may go to a low logic level (i.e. ground), with word line WL at a ground potential, p-channel JFETs (212 and 222) in X-cell 210 and Y-cell 220, respectively, may be turned on and charge may be transferred from a bit line (BLX and BLY) to a respective data storing node (XD and YD).

Because a capacitor (214 and 214) stores the data values in X-cell 210 and Y-cell 220, respectively, the charge stored may slowly leak away over time, which could create data integrity issues. For this reason, refresh circuitry may be incorporated in a CAM device incorporating TCAM cell 200. Such refresh circuitry may include circuitry for activating the word line WL and reading the data value stored on data storing nodes (XD and YD) via bit lines (BLX and BLY) and re-writing the data values at full voltage levels.

P-channel JFETs (212 and 222) may reduce leakage from data storage nodes when word line WL is in a disable state (i.e. logic high). When word line WL is in the disable state, p-channel JFETs (212 and 222) may be turned off and data storage nodes (XD and YD) may be electrically isolated from bit lines (BLX and BLY).

Figure 3:
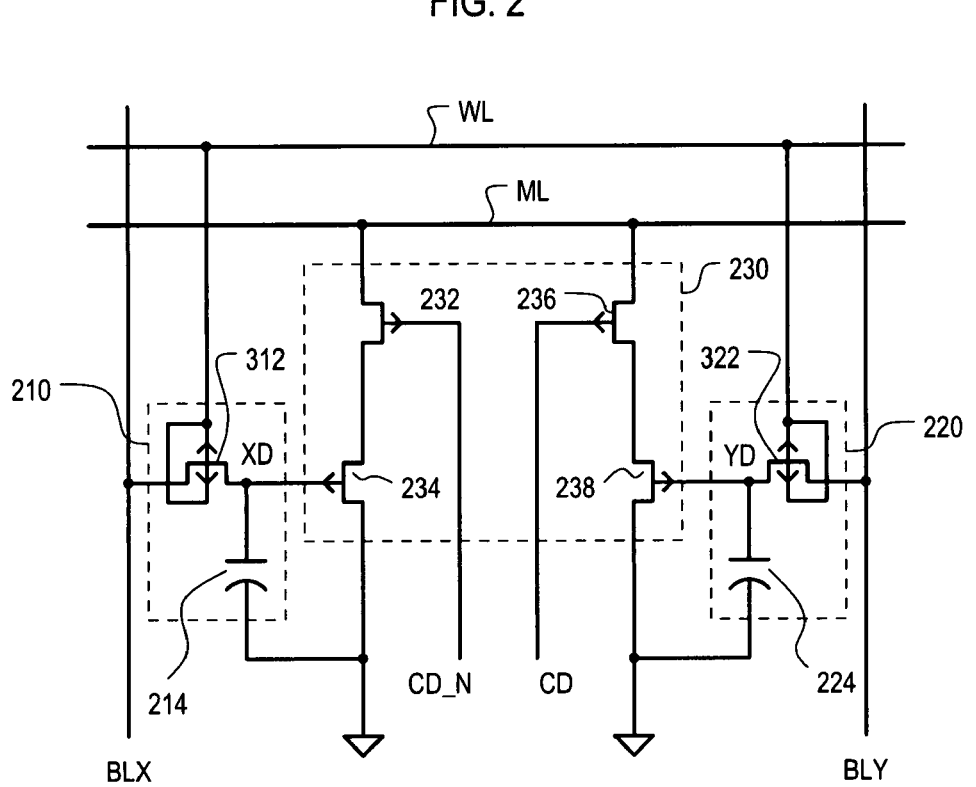
FIG. 3 is a circuit schematic diagram of a TCAM cell according to an embodiment.

Referring now to FIG. 3, a circuit schematic diagram of a TCAM cell according to an embodiment is set forth and given the general reference character 300.

TCAM cell 300 may include the same constituents as TCAM cell 200 except X-cell 210 and Y-cell 220 may each include p-channel JFETs (312 and 322) having front control gates and back control gates. By doing so, p-channel JFETs (312 and 322) may have reduced current leakage when turned off (i.e. when word line WL is in the disable state). In this way, data storage nodes (XD and YD) may hold data values longer and refresh operations can be reduced.

Figure 4:
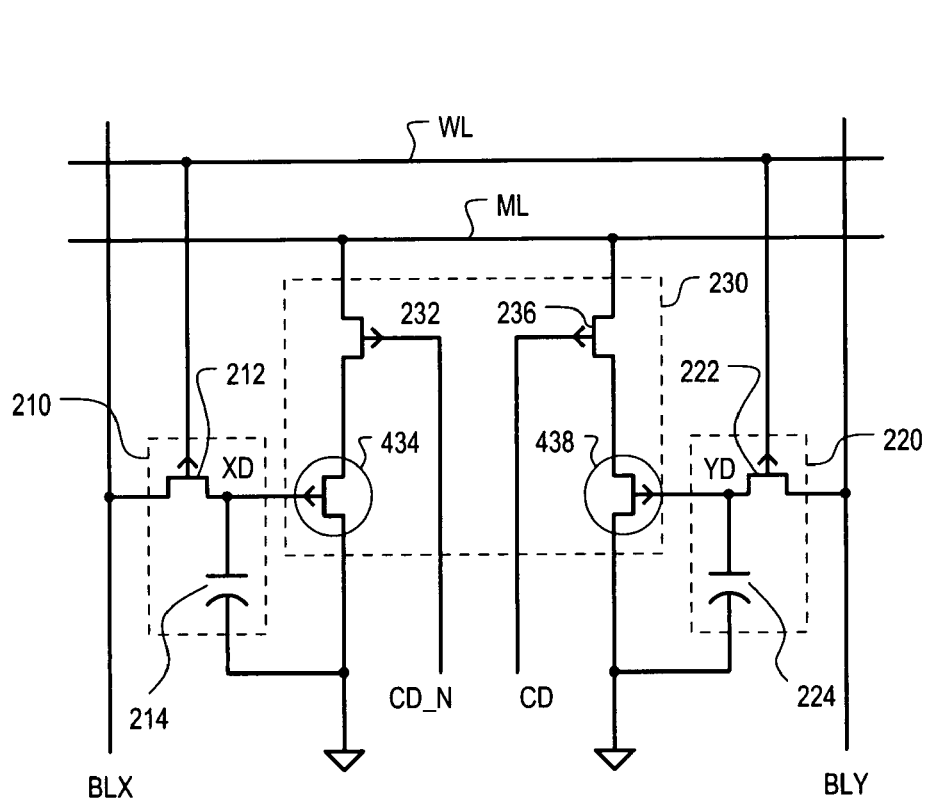
FIG. 4 is a circuit schematic diagram of a TCAM cell according to an embodiment.

Referring now to FIG. 4, a circuit schematic diagram of a TCAM cell according to an embodiment is set forth and given the general reference character 400.

TCAM cell 400 may include the same constituents as TCAM cell 200 except compare circuit 230 comprises p-channel JFETs (434 and 438) instead of p-channel JFETs (234 and 238). P-channel JFETs (434 and 438) may be depletion mode devices. By providing p-channel JFETs (434 and 438) as depletion mode devices, compare speeds may be improved.

Operation of TCAM cell 400 may differ from operation of TCAM cell 200 in that word line WL may be driven lower than zero volts when enabled for a write or refresh operation to ensure a proper zero logic level is written. Word line WL may be driven to −0.2 volts, as just one example.

Figure 5:
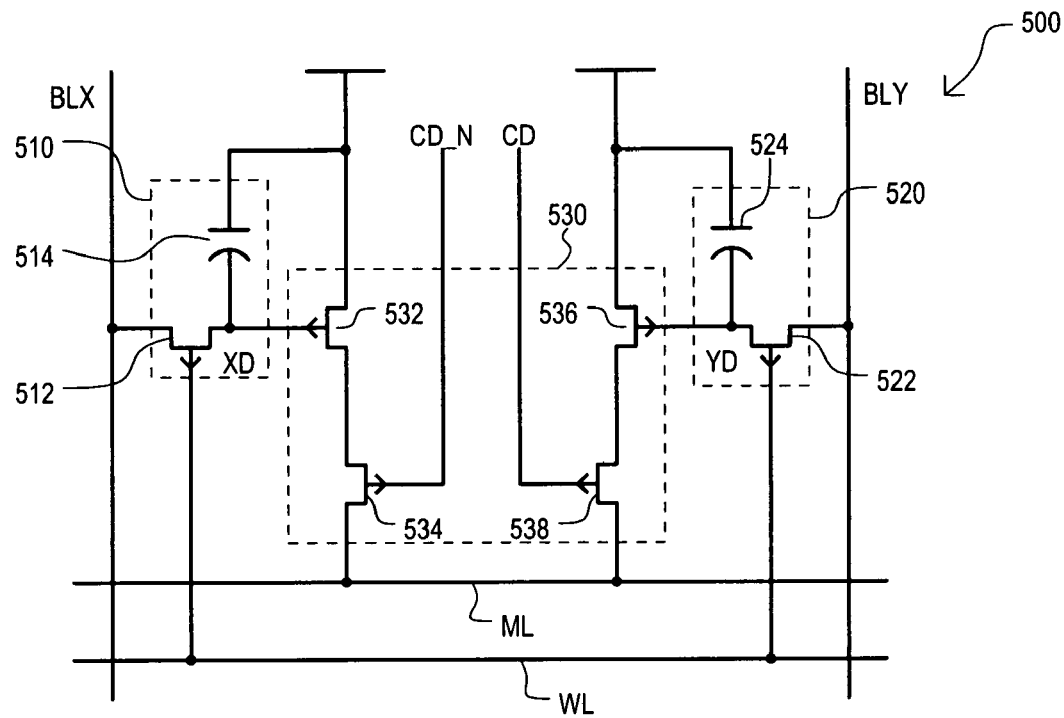
FIG. 5 is a circuit schematic diagram of a TCAM cell according to an embodiment.

Referring now to FIG. 5, a circuit schematic diagram of a TCAM cell according to an embodiment is set forth and given the general reference character 500.

TCAM cell 500 may include similar constituents as TCAM cell 200. Such constituents can have the same reference character except starting with a "5" instead of a "2".

TCAM cell 500 includes a X-cell 510, a Y-cell 520, and a compare circuit 530. TCAM cell 500 has a bit line BLX as an input to X-cell 510, and bit lines BLY as an input to Y-cell 520. X-cell 510 and Y-cell 520 receive a word line WL as a common input. Compare circuit 530 receives complementary compare data (CD and CD_N) as inputs as well as receiving X-cell stored data and Y-cell stored data respectively at data storing nodes (YD and XD). Compare circuit 530 provides a match output ML. Complementary compare data (CD and CD_N) may include compare data CD and compare data complement CD_N.

X-cell 510 can include a pass transistor 512 and a capacitor 514. Pass transistor 512 can be a p-channel JFET and can have a first source/drain terminal connected to bit line BLX and a second source/drain terminal connected to a first terminal of capacitor 514 to provide X-cell data from data storing node XD. Pass transistor 512 can have a control gate terminal connected to word line WL. Capacitor 514 can have a second terminal connected to a power supply VDD potential.

Y-cell 520 can include a pass transistor 522 and a capacitor 524. Pass transistor 522 can be a p-channel JFET and can have a first source/drain terminal connected to bit line BLY and a second source/drain terminal connected to a first terminal of capacitor 524 to provide Y-cell data from data storing node YD. Pass transistor 522 can have a control gate terminal connected to word line WL. Capacitor 524 can have a second terminal connected to a power supply VDD potential.

Compare circuit 530 can receive X-cell data from data storing node XD, Y-cell data from data storing node YD, and complementary compare data (CD and CD_N) as inputs. Compare circuit 530 can include a first compare stack including p-channel JFETs (532 and 534) and a second compare stack including p-channel JFETs (536 and 538).

In the first compare stack, p-channel JFET 532 can have a drain terminal connected to a power supply potential VDD, a source terminal connected to a drain terminal of p-channel JFET 534, and a control gate connected to receive X-cell data from data storing node XD in X-cell 510. P-channel JFET 534 can have a source terminal connected to a match line ML and a control gate terminal connected to receive compare data complement CD_N.

In the second compare stack, p-channel JFET 536 can have a drain terminal connected to a power supply potential VDD, a source terminal connected to a drain terminal of p-channel JFET 538, and a control gate connected to receive Y-cell data from data storing node YD in Y-cell 520. P-channel JFET 538 can have a source terminal connected to a match line ML and a control gate terminal connected to receive compare data CD.

In operation, TCAM cell 500 may store a one value ("1"), a zero value ("0") or a "don't care" value ("1/0"). In the one value ("1"), X-cell 510 stores a logic high at data storing node XD and Y-cell 520 stores a logic low value at data storing node YD. In the zero value ("0"), X-cell stores 510 a logic low at data storing node XD and Y-cell 520 stores a logic high value at data storing node YD. In the "don't care" value ("0/1"), X-cell stores 510 a logic high at data storing node XD and Y-cell 520 stores a logic high value at data storing node YD.

Before a compare operation, compare data and complementary compare data lines (CD and CD_N) may be initially (precharged) at a high level (Vcc), while match line ML may be initially (precharged) at a low level, such as a ground potential. Because, compare data and complementary compare data lines (CD and CD_N) are at a high level, p-channel JFETs (534 and 538) are turned off. With p-channel JFETs (534 and 538) turned off, current is prevented from flowing through p-channel JFET compare stacks (532-534 and 536-538) from the match line ML to the power supply potential VDD.

When the compare operation occurs, either compare data line or complementary compare data line (CD or CD_N) transitions to a low level. In this way, one of the compare stacks (532-534 and 536-538) becomes enabled by turning on the respective p-channel JFET (534 or 538). A mis-match may occur when the enabled compare stack (532-534 and 536-538) receives a logic low level from the respective data storing node (XD or YD) at the respective p-channel JFETs (532 or 536). When a compare mis-match occurs both p-channel JFETs in the enabled compare stack (532-534 and 536-538) are turned on and the match line ML is pulled to the power supply potential VDD (i.e. a logic high). On the other hand, a match may occur when the enabled compare stack (532-534 and 536-538) receives a logic high level from the respective data storing node (XD or YD) at the respective p-channel JFET (532 or 536). When a compare match occurs the upper p-channel JFET (532 or 536) in the enabled compare stack (532-534 and 536-538) is turned off and the match line ML remains at the precharge level (low or ground potential).

A match may be conceptualized as a hit and a mis-match may be conceptualized as a miss. Thus, when a match occurs, a sense amplifier (not shown) coupled to match line ML may detect a "hit" and when a mis-match occurs, the sense amplifier may detect a "miss."

However, when TCAM 500 stores a "don't care" value ("1/0"), both data storing nodes (XD and YD) store a logic one. With both data storing nodes (XD and YD) storing a logic one (i.e. a high level such as Vcc), p-channel JFETS (532 and 536) are turned off and compare circuit 530 indicates a match and the match line ML remains at the precharge level (low or ground).

X-cell 510 and Y-cell 520, respectively, include a capacitor (514 and 524) for storing a charge representative of data on respective data storing nodes (XD and YD). X-cell 510 and Y-cell 520, respectively, may include a p-channel JFET (512 and 522) that may operate as a pass transistor to allow charge to be transferred to or from a respective capacitor (514 and 524) and a respective bit line (BLX and BLY).

In a write operation, word line WL may go to a low logic level (i.e. ground), with word line WL at a ground potential, p-channel JFETs (512 and 522) in X-cell 510 and Y-cell 520, respectively, may be turned on and charge may be transferred from a bit line (BLX and BLY) to a respective data storing node (XD and YD).

Because a capacitor (514 and 524) stores the data values in X-cell 510 and Y-cell 520, respectively, the charge stored may slowly leak away over time, which could create data integrity issues. For this reason, refresh circuitry may be incorporated in a CAM device incorporating TCAM cell 500. Such refresh circuitry may include circuitry for activating the word line WL and reading the data value stored on data storing nodes (XD and YD) via bit lines (BLX and BLY) and re-writing the data values at full voltage levels.

P-channel JFETs (512 and 522) may reduce leakage from data storage nodes when word line WL is in a disable state (i.e. logic high). When word line WL is in the disable state, p-channel JFETs (512 and 522) may be turned off and data storage nodes (XD and YD) may be electrically isolated from bit lines (BLX and BLY).

It should be noted p-channel JFETs (512 and 522) may be double gated p-channel JFETs, such as double-gated p-channel JFETs (312 and 322) of the embodiment of FIG. 3. In this way, leakage from data storage nodes (XD and YD) may be further reduced.

By providing a "pull up" (i.e. charging to VDD, for example) configuration for match line ML when a mis-match occurs, compare speeds may be increased. This is because a p-channel JFET has holes as a majority carrier and may have greater "pull up" capabilities than "pull down" (i.e. discharging to ground, for example) capabilities.

Figure 6:
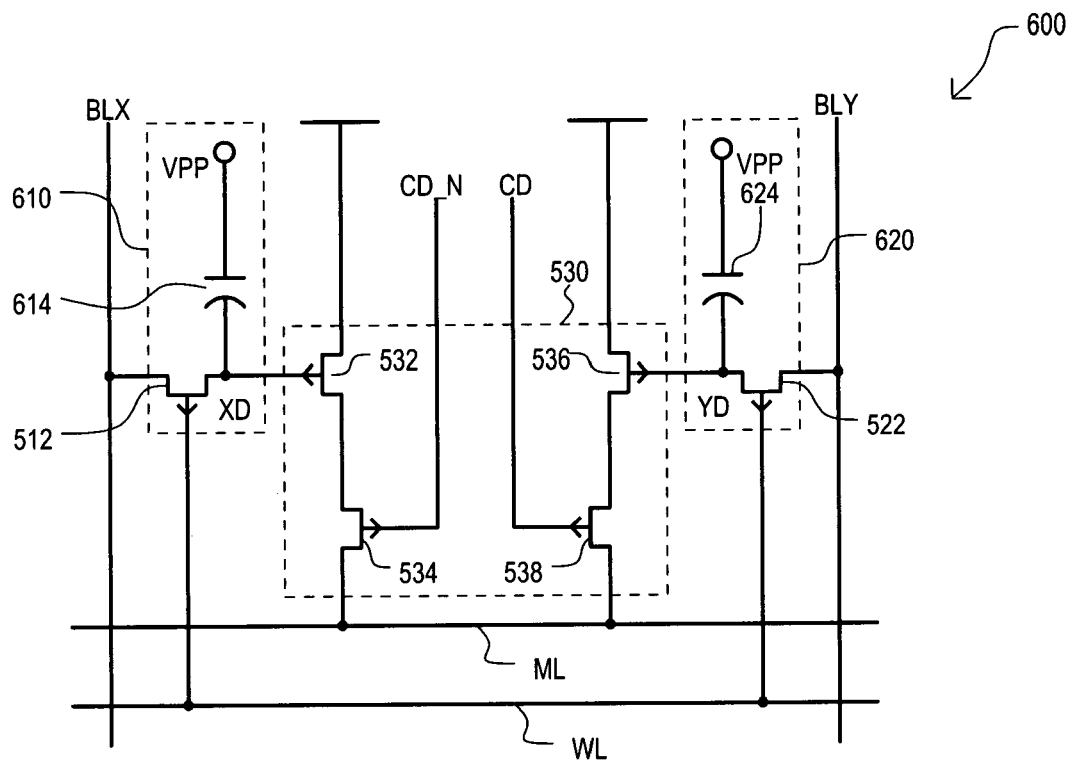
FIG. 6 is a circuit schematic diagram of a TCAM cell according to an embodiment.

Referring now to FIG. 6, a circuit schematic diagram of a TCAM cell according to an embodiment is set forth and given the general reference character 600.

TCAM cell 600 may include the same constituents as TCAM cell 500 except TCAM 600 may include an X-cell 610 and Y-cell 620 having capacitors (614 and 624) a capacitor terminal connected to a boosted voltage VPP instead of a power supply VDD, where VPP is a voltage higher than power supply voltage VDD used in first and second stacks of compare circuit 530. A boosted voltage VPP may be formed by using a pump circuit incorporating boost capacitors to provide a boosted voltage VPP from a power supply voltage VDD. Alternatively, power supply voltage VDD may be a stepped down voltage from an external power supply voltage provided external to a semiconductor device while the boosted voltage VPP may be the external power supply voltage or a voltage stepped down less than power supply voltage VDD. Otherwise, the configuration and operation of TCAM cell 600 may be the same as TCAM cell 500.

Figure 7:
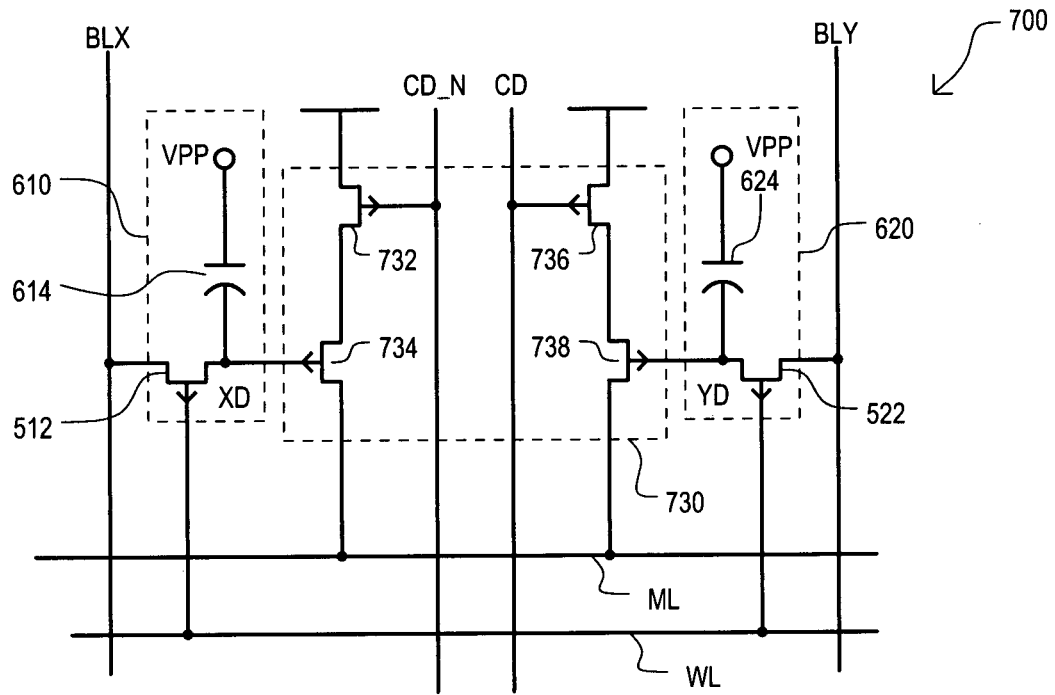
FIG. 7 is a circuit schematic diagram of a TCAM cell according to an embodiment.

Referring now to FIG. 7, a circuit schematic diagram of a TCAM cell according to an embodiment is set forth and given the general reference character 700.

TCAM cell 700 may include the same configuration as TCAM cell 600 except TCAM cell 700 may include a compare circuit 730 in which the first compare stack including p-channel JFETs (732 and 734) and second compare stack including p-channel JFETs (736 and 738). The first compare stack including P-channel JFETs (732 and 734) is reversed, such that the p-channel JFET 732 receiving compare data complement CD_N is on the top of the stack (i.e. connected to power supply VDD) and p-channel JFET 734 receiving X-cell data from data storing node XD is on the bottom of the stack (i.e. connected to the match line ML). The second compare stack including P-channel JFETs (736 and 738) is also reversed, such that the p-channel JFET 736 receiving compare data CD is on the top of the stack (i.e. connected to power supply VDD) and p-channel JFET 738 receiving Y-cell data from data storing node YD is on the bottom of the stack (i.e. connected to the match line ML).

By reversing the order of the p-channel JFETs in the first and second stacks, noise margins may be improved.

Any of the p-channel JFETs used as access transistors in X-cells and/or Y-cells may be double gate p-channel JFETs which may thereby reduce current leakage and refresh frequency may be reduced. In this way, overall current consumption may be reduced.

Previous embodiments have been directed toward a CAM cell and more particularly to a TCAM cell. Embodiments directed to a dynamic random access memory (DRAM) cell will now be discussed.

Figure 8:
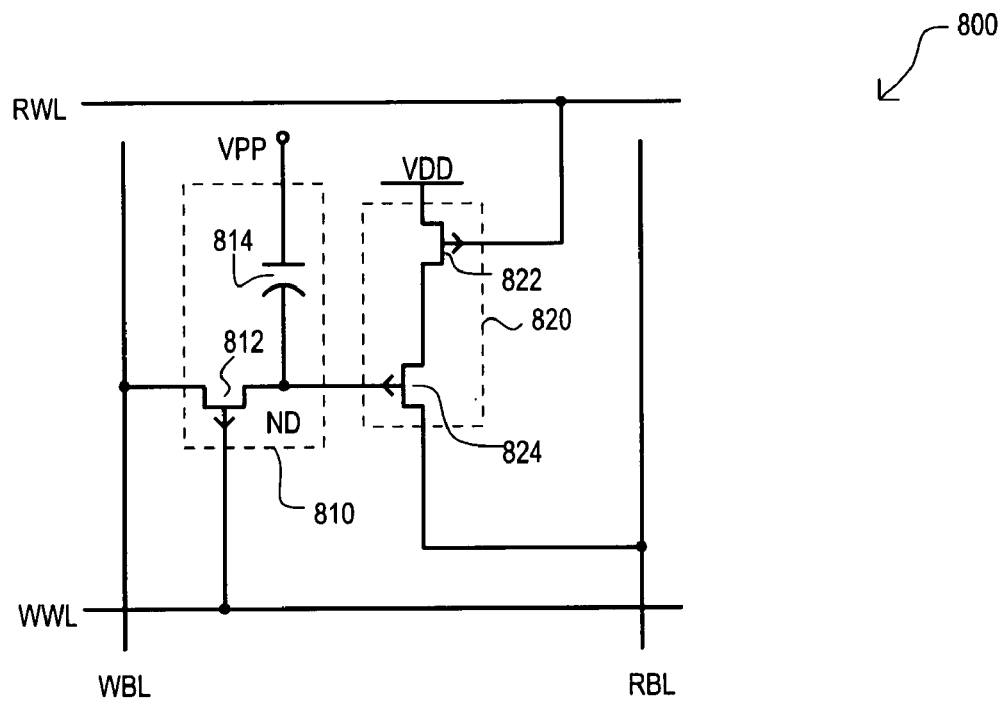
FIG. 8 is a circuit schematic diagram of a dynamic random access memory (DRAM) cell according to an embodiment.

Referring now to FIG. 8, a circuit schematic diagram of a DRAM cell according to an embodiment is set forth and given the general reference character 800.

DRAM cell 800 may include data storing portion 810 and a data read portion 820.

Data storing portion 810 may include a pass transistor 812 and a capacitor 814. Pass transistor 812 can be a p-channel JFET and can have a first source/drain terminal connected to write bit line WBL and a second source/drain terminal connected to a first terminal of capacitor 814 to store data on data storing node ND. Pass transistor 812 can have a control gate terminal connected to write word line WWL. Capacitor 814 can have a second terminal connected to a boosted power supply potential VPP. Boosted power supply potential VPP may be greater than a power supply potential VDD.

Data read portion 820 may include a data read stack including p-channel JFETs (822 and 824). In data read stack, p-channel JFET 822 can have a drain terminal connected to a power supply potential VDD, a source terminal connected to a drain terminal of p-channel JFET 824, and a control gate connected to a read word line RWL. P-channel JFET 824 can have a source terminal connected to a read bit line RBL and a control gate terminal connected to receive data from data storing node ND data storing portion 810.

DRAM cell 800 stores data by storing charge on capacitor 814 in data storing portion 810. A first logic level may be storing charge on capacitor 814 such that a positive voltage is provided on data storing node ND. A second logic level may be such that no charge is stored on capacitor 814 such that data storing node ND may be at essentially zero volts.

In a standby state, write word line WWL may be at a logic high level, read word line RWL may be at a logic high level, write bit line WBL may be at either a logic high or a logic low level, and read bit line RBL may be at a logic low level. Thus, in a standby state, pass transistor 812 and p-channel JFET 822 may be turned off.

In a write mode of operation, write word line WWL may transition from a logic high level (i.e. VDD) to a logic low level (i.e. ground). With write bit line WBL at a logic low level, pass transistor 812 (a p-channel JFET) may turn on. With pass transistor 812 turned on, a potential applied to the write bit line WBL may be transferred to capacitor 814 at data storing node ND. If data having a first logic level is to be written to DRAM cell 800, write bit line WBL can be at a logic high level (i.e. VDD). If data having a second logic level is to be written to DRAM cell 800, write bit line WBL can be at a logic low level (i.e. ground). Once the data is written to data storing node ND, write word line WWL may return to a logic high level (i.e. VDD) and pass transistor 812 can be turned off. With pass transistor 812 turned off, the charge representing data may be trapped at data storing node ND.

In a read mode of operation, read word line RWL may transition from a logic high level to a logic low level (i.e. ground). With read word line RWL at a logic low level, p-channel JFET 822 in the read stack may be turned on. If the data stored on data storing node ND is the second logic level (i.e. ground), then p-channel JFET 824 in read stack is also turned on. With both p-channel JFETs (822 and 824) turned on, read bit line RBL may be pulled up to a power supply potential VDD. A sense amplifier (not shown) connected to read bit line RBL may sense this voltage to provide the second logic level as an output. However, if the data stored on data storing node ND is the first logic level (i.e. VDD), then p-channel JFET 824 in the read stack may be turned off. With p-channel JFET 824 turned off, read bit line RBL may remain at the precharged potential (ground). A sense amplifier (not shown) connected to read bit line RBL may sense this voltage to provide the first logic level as an output.

The charge stored on data storing node ND may slowly leak away. Thus, a refresh operation may be periodically performed. A refresh operation may include a read operation followed by a write operation, where the logic level read from DRAM memory cell 800 in the read operation may be re-written back to the data storing node ND in the write operation.

Pass transistor 812 may be a double gate JFET, such as double gate JFET 312 or double gate JFET 322 in TCAM cell 300. By using a double gate JFET, leakage of charge from data storing node ND may be reduced and refresh frequency may be decreased.

Figure 9:
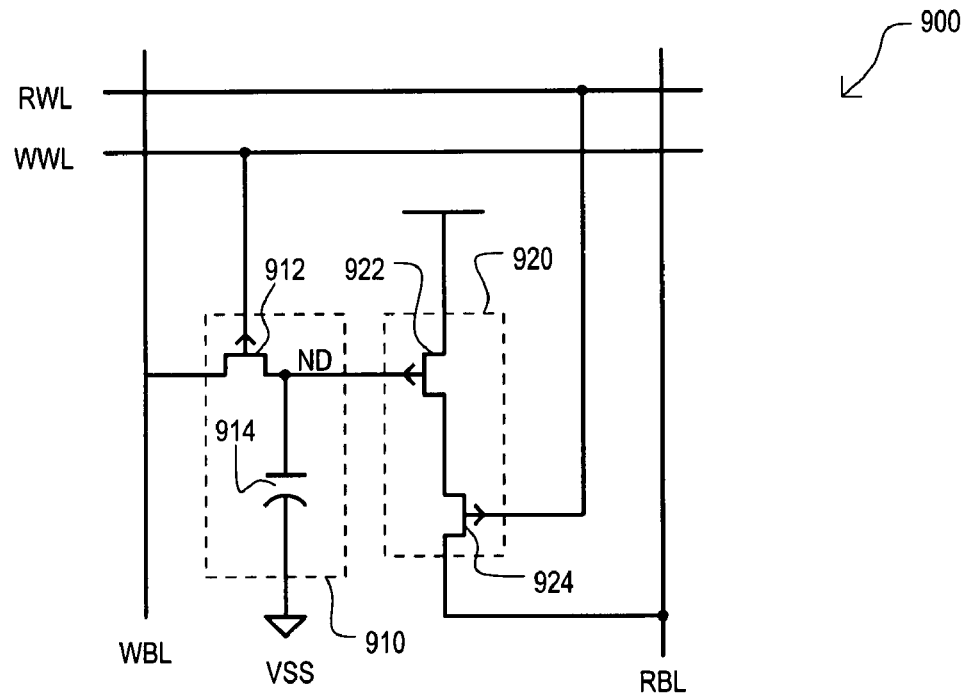
FIG. 9 is a circuit schematic diagram of a DRAM cell according to an embodiment.

Referring now to FIG. 9, a circuit schematic diagram of a DRAM cell according to an embodiment is set forth and given the general reference character 900.

DRAM cell 900 may include data storing portion 910 and a data read portion 920.

Data storing portion 910 may include a pass transistor 912 and a capacitor 914. Pass transistor 912 can be a p-channel JFET and can have a first source/drain terminal connected to write bit line WBL and a second source/drain terminal connected to a first terminal of capacitor 914 to store data on data storing node ND. Pass transistor 912 can have a control gate terminal connected to write word line WWL. Capacitor 914 can have a second terminal connected to ground potential VSS.

Data read portion 920 may include a data read stack including p-channel JFETs (922 and 924). In data read stack, p-channel JFET 922 can have a drain terminal connected to a power supply potential VDD, a source terminal connected to a drain terminal of p-channel JFET 924, and a control gate connected to receive data from data storing node ND data storing portion 810. P-channel JFET 924 can have a source terminal connected to a read bit line RBL and a control gate terminal connected to and a control gate connected to a read word line RWL.

DRAM cell 900 stores data by storing charge on capacitor 914 in data storing portion 910. A first logic level may be storing charge on capacitor 914 such that a positive voltage is provided on data storing node ND. A second logic level may be such that no charge is stored on capacitor 914 such that data storing node ND may be at essentially zero volts.

In a standby state, write word line WWL may be at a logic high level, read word line RWL may be at a logic high level, write bit line WBL may be at either a logic high or a logic low level, and read bit line RBL may be at a logic low level. Thus, in a standby state, pass transistor 912 and p-channel JFET 924 may be turned off.

In a write mode of operation, write word line WWL may transition from a logic high level (i.e. VDD) to a logic low level (i.e. ground). With write bit line WBL at a logic low level, pass transistor 912 (a p-channel JFET) may turn on. With pass transistor 912 turned on, a potential applied to the write bit line WBL may be transferred to capacitor 914 at data storing node ND. If data having a first logic level is to be written to DRAM cell 900, write bit line WBL can be at a logic high level (i.e. VDD). If data having a second logic level is to be written to DRAM cell 900, write bit line WBL can be at a logic low level (i.e. ground). Once the data is written to data storing node ND, write word line WWL may return to a logic high level (i.e. VDD) and pass transistor 912 can be turned off. With pass transistor 912 turned off, the charge representing data may be trapped at data storing node ND.

In a read mode of operation, read word line RWL may transition from a logic high level to a logic low level (i.e. ground). With read word line RWL at a logic low level, p-channel JFET 924 in the read stack may be turned on. If the data stored on data storing node ND is the second logic level (i.e. ground), then p-channel JFET 922 in read stack is also turned on. With both p-channel JFETs (922 and 924) turned on, read bit line RBL may be pulled up to a power supply potential VDD. A sense amplifier (not shown) connected to read bit line RBL may sense this voltage to provide the second logic level as an output. However, if the data stored on data storing node ND is the first logic level (i.e. VDD), then p-channel JFET 922 in the read stack may be turned off. With p-channel JFET 922 turned off, read bit line RBL may remain at the precharged potential (ground). A sense amplifier (not shown) connected to read bit line RBL may sense this voltage to provide the first logic level as an output.

The data storing node ND may have a data storing node logic value. The read portion 920 may provide read data on read bit line RBL. The read data may have a read data logic value that corresponds to the data storing node logic value.

The charge stored on data storing node ND may slowly leak away. Thus, a refresh operation may be periodically performed. A refresh operation may include a read operation followed by a write operation, where the logic level read from DRAM memory cell 900 in the read operation may be re-written back to the data storing node ND in the write operation.

Pass transistor 912 may be a double gate JFET, such as double gate JFET 312 or double gate JFET 322 in TCAM cell 300. By using a double gate JFET, leakage of charge from data storing node ND may be reduced and refresh frequency may be decreased.

It should be noted data storing portions (810 and 910) in DRAM cells (800 and 900) are essentially the same circuit configuration as X-cell and Y-cell in various of the TCAM cells (200 to 700) of FIGS. 2 to 7. Also, data read portions (820 and 920) in DRAM cells (800 and 900) may be essentially the same circuit configuration as compare stacks in compare circuits in various of the TCAM cells (200 to 700) of FIGS. 2 to 7.

The JFETs in the above embodiments may have a controllable impedance path between their respective source terminal and drain terminal. The controllable impedance path may be controlled by the control gate terminal.

Thus, an of memory cells may be configured as TCAM cells or DRAM cells.

The semiconductor devices of the embodiments may be manufactured in accordance with known process steps.

Reference in the description to "one embodiment" or "an embodiment" means that a particular feature, structure, or characteristic described in connection with the embodiment is included in at least one embodiment of the invention. The appearance of the phrase "in one embodiment" in various places in the specification do not necessarily all refer to the same embodiment. The term "to couple" or "electrically connect" as used herein may include both to directly and to indirectly connect through one or more intervening components.

Further it is understood that the embodiments of the invention may be practiced in the absence of an element or step not specifically disclosed. That is an inventive feature of the invention may include an elimination of an element.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device, comprising:
    a memory cell including
        a first junction field effect transistor (JFET) having a first controllable impedance path coupled between a first bit line and a data storing node, the first JFET includes a first control gate terminal coupled to a first word line; and
        a capacitor having a first terminal coupled to the data storing node and a second terminal coupled to a first potential.

2. The semiconductor device of claim 1, wherein the memory cell further includes:
    a first stack including a second JFET having a second controllable impedance path and a third JFET having a third controllable impedance path, the second and third controllable impedance paths coupled in series between a second potential and a second bit line and the second JFET includes a second control gate terminal coupled to the data storing node and the third JFET includes a third control gate terminal coupled to a second word line.

3. The semiconductor device of claim 2, wherein:
    the first JFET, the second JFET, and the third JFET are p-channel JFETs.

4. The semiconductor device of claim 2, wherein:
    the second JFET has a source terminal coupled to the second potential and a drain terminal coupled to a source terminal of the third JFET and the third JFET has a drain terminal coupled to the second bit line.

5. The semiconductor device of claim 2, wherein:
    the third JFET has a source terminal coupled to the second potential and a drain terminal coupled to a source terminal of the second JFET and the second JFET has a drain terminal coupled to the second bit line.

6. The semiconductor device of claim 2, wherein:
    the first potential is higher than the second potential.

7. The semiconductor device of claim 6, wherein:
    the first potential is a boosted voltage; and
    the second potential is a power supply potential.

8. The semiconductor device of claim 2, wherein:
the first potential is a ground potential; and
the second potential is a power supply potential.

9. The semiconductor device of claim 1 wherein the memory cell is a dynamic random access memory (DRAM) cell.

10. The semiconductor device of claim 9 wherein the memory cell requires a periodic refresh.

11. The semiconductor device of claim 1, wherein the first JFET includes a second gate terminal coupled to the word line.

12. A semiconductor device, comprising:
a content addressable memory (CAM) cell including
a first junction field effect transistor (JFET) having a first controllable impedance path coupled between a first bit line and
a first data storing node, the first JFET includes a first JFET control gate coupled to a word line;
a first capacitor having a first terminal and a second terminal, and the first terminal being coupled to the first data storing node; and
a first stack including a second JFET having a second controllable impedance path and a third JFET having a third controllable impedance path, the second and third controllable impedance paths coupled in series between a first potential and a match line and the second JFET includes a second control gate terminal coupled to the first data storing node and the third JFET includes a third control gate terminal coupled to receive first compare data.

13. The semiconductor device of claim 12, wherein the first JFET includes a second first JFET control gate coupled to the word line.

14. The semiconductor device of claim 12, wherein the second JFET is a depletion mode JFET.

15. The semiconductor device of claim 12, wherein:
the first, second, and third JFETs are p-channel JFETs.

16. The semiconductor device of claim 12, wherein:
the first potential is a power supply potential.

17. The semiconductor device of claim 16, wherein:
the second terminal of the capacitor is coupled to a boosted power supply potential greater than the power supply potential.

18. The semiconductor device of claim 12, wherein:
the third JFET has a source coupled to the match line and a drain coupled to a source of the second JFET and the second JFET includes a drain coupled to the first potential and the first potential is a ground potential.

19. The semiconductor device of claim 12, wherein:
the third JFET has a source coupled to the first potential and a drain coupled to a source of the second JFET and the second JFET includes a drain coupled to the match line and the first potential is a power supply potential.

20. The semiconductor device of claim 12, wherein:
the second JFET has a source coupled to the first potential and a drain coupled to a source of the third JFET and the third JFET includes a drain coupled to the match line and the first potential is a power supply potential.

21. The semiconductor device of claim 12, wherein the CAM cell further includes:

a fourth JFET having a fourth controllable impedance path coupled between a second bit line and a second data storing node, the fourth JFET includes a first control gate terminal coupled to the word line;
a second capacitor having a first terminal and a second terminal and the first terminal of the second capacitor being coupled to the second data storing node; and
a second stack including a fifth JFET having a fifth controllable impedance path and a sixth JFET having a sixth controllable impedance path, the fifth and sixth controllable impedance paths coupled in series between the first potential and the match line and the fifth JFET includes a fifth control gate terminal coupled to the second data storing node and the sixth JFET includes a sixth control gate terminal coupled to receive second compare data.

22. The semiconductor device of claim 21, wherein:
the second compare data is complementary to the first compare data.

23. The semiconductor device of claim 21, wherein:
the CAM cell is a ternary CAM cell.

24. The semiconductor device of claim 12, wherein:
the first data storing node requires periodic refresh.

25. A semiconductor device, comprising:
a dynamic random access memory (DRAM) cell including
a data storing portion including a first p-channel junction field effect transistor (JFET) and coupled to receive a write bit line and a write word line as inputs for storing a data logic value on a data storing node coupled to the first JFET and a capacitor; and
a data read portion including a second p-channel JFET and coupled to receive the data logic value from the data storing node and a read word line as inputs and providing read data on a read word line as an output wherein the read data has the data logic value.

26. A semiconductor device, comprising:
a content addressable memory cell (CAM) including
a first data storing portion including a first junction field effect transistor (JFET) and coupled to receive a first bit line and a word line as inputs for storing a first data logic value on a first data storing node coupled to the first JFET and a first capacitor; and
a first data compare portion including a second JFET and coupled to receive the first data logic value from the first data storing node and a first compare data as inputs and providing a compare result on a match line, the compare result based on the first data logic value and the first compare data.

27. The semiconductor device of claim 26, wherein the CAM cell further includes:
a second data storing portion including a third junction field effect transistor (JFET) and coupled to receive a second bit line and the word line as inputs for storing a second data logic value on a second data storing node coupled to the third JFET and a second capacitor; and
a second data compare portion including a fourth JFET and coupled to receive the second data logic value from the second data storing node and a second compare data as inputs and providing the compare result on the match line, the compare result based on the second data logic value and the second compare data.

* * * * *